(12) United States Patent
Chen

(10) Patent No.: US 11,336,088 B2
(45) Date of Patent: May 17, 2022

(54) TRANSIENT VOLTAGE SUPPRESSION DEVICE

(71) Applicant: IPU SEMICONDUCTOR CO., LTD., Zhunan Township, Miaoli County (TW)

(72) Inventor: Chih-Hao Chen, Hsinchu County (TW)

(73) Assignee: IPU SEMICONDUCTOR CO., LTD., Miaoli County (TW)

( * ) Notice: Subject to any disclaimer, the term of this patent is extended or adjusted under 35 U.S.C. 154(b) by 39 days.

(21) Appl. No.: 16/662,042

(22) Filed: Oct. 24, 2019

(65) Prior Publication Data

US 2020/0235573 A1 Jul. 23, 2020

(30) Foreign Application Priority Data

Jan. 17, 2019 (CN) .......................... 201910042925.5

(51) Int. Cl.
*H02H 9/04* (2006.01)
*H02H 3/10* (2006.01)
*H02H 3/20* (2006.01)
*H01L 29/866* (2006.01)
*H01L 27/02* (2006.01)

(52) U.S. Cl.
CPC ......... *H02H 9/046* (2013.01); *H01L 27/0248* (2013.01); *H01L 29/866* (2013.01); *H02H 3/10* (2013.01); *H02H 3/20* (2013.01)

(58) Field of Classification Search
CPC . H02H 9/046; H02H 3/10; H02H 3/20; H01L 27/0248; H01L 29/866
USPC .................................................. 361/56, 111
See application file for complete search history.

(56) References Cited

U.S. PATENT DOCUMENTS

| | | | | |
|---|---|---|---|---|
| 5,341,267 | A | * | 8/1994 | Whitten ................... H01L 23/60 257/530 |
| 8,760,829 | B2 | | 6/2014 | Wang et al. |
| 2002/0079865 | A1 | * | 6/2002 | Thomas ................... H02H 9/042 320/136 |
| 2005/0078427 | A1 | * | 4/2005 | Castro .................... H02H 9/045 361/119 |
| 2011/0211289 | A1 | * | 9/2011 | Kosowsky ........... H05K 1/0259 361/91.1 |
| 2016/0149402 | A1 | * | 5/2016 | Ye .......................... H02H 9/041 361/56 |

FOREIGN PATENT DOCUMENTS

CN 204885150 12/2015

\* cited by examiner

*Primary Examiner* — Kevin J Comber
(74) *Attorney, Agent, or Firm* — Li & Cai Intellectual Property Office

(57) ABSTRACT

Provided is a transient voltage suppression device including a power supply terminal, a ground terminal, a Zener diode, a diode string, and an isolation device. The Zener diode is coupled between the power supply terminal and the ground terminal, and a node is between the Zener diode and the power supply terminal. The diode string has a first terminal, a second terminal, and an input/output (I/O) terminal. The second terminal is coupled to the ground terminal. The isolation device is coupled between the node and the first terminal. When an abnormal current flows through the isolation device and an energy of the abnormal current per unit time exceeds a preset value of the isolation device, the isolation device blocks a path of the abnormal current.

3 Claims, 6 Drawing Sheets

TRANSIENT VOLTAGE SUPPRESSION DEVICE

CROSS REFERENCE TO RELATED APPLICATION

This application claims the priority benefit of China application serial no. 201910042925.5, filed on Jan. 17, 2019. The entirety of the above-mentioned patent application is hereby incorporated by reference herein and made a part of this specification.

BACKGROUND OF THE INVENTION

Field of the Invention

The invention relates to an electrostatic discharge protection device, and more particularly to a transient voltage suppression device.

Description of Related Art

With the rapid development of current technology, integrated circuits are widely used in electronic devices. Electrostatic discharge (ESD) events are one of the main problems leading to the damages of the integrated circuits. Furthermore, not only the integrated circuits, but also host systems containing the integrated circuits may be damaged.

In the prior art, a transient voltage suppressor (TVS) is used for electrostatic discharge protection. However, when a charged component is plugged in the host being in the off state, a reverse current flows from the charged component back to a power supply terminal (Vdd) of the host, thereby causing damages of other circuit components of the host. On the other hand, when a high voltage between the power supply terminal and the ground terminal of the transient voltage suppressor is maintained for a long time and continuously conducting, it is likely to cause an electrical over stress (EOS) phenomenon between the power supply terminal and the ground terminal. That is to say, the transient voltage suppressor is subjected to a current or a voltage exceeding it can withstand, so that the components in the transient voltage suppressor are damaged, thereby causing the system to burn out due to a short circuit between the power supply terminal and the ground terminal. This is a problem that has long been addressed by those skilled in the art.

SUMMARY OF THE INVENTION

The invention provides a transient voltage suppression device that blocks the electrical over stress (EOS) current and has an ESD protection ability at the same time.

The invention provides a transient voltage suppression device including a power supply terminal, a ground terminal, a Zener diode, a diode string, and an isolation device. The Zener diode is coupled between the power supply terminal and the ground terminal, and a node is between the Zener diode and the power supply terminal. The diode string has a first terminal, a second terminal, and an input/output (I/O) terminal. The second terminal is coupled to the ground terminal. The isolation device is coupled between the node and the first terminal. When an abnormal current flows through the isolation device and an energy of the abnormal current per unit time exceeds a preset value of the isolation device, the isolation device blocks a path of the abnormal current.

In an embodiment of the invention, the isolation device includes a capacitor and the preset value corresponds to a saturation energy or a capacitance value of the capacitor.

In an embodiment of the invention, the isolation device includes a fuse and the preset value corresponds to a rating of the fuse.

In an embodiment of the invention, the fuse includes a metal layer, a polysilicon layer, or a combination thereof.

In an embodiment of the invention, the isolation device includes a plurality of fuses connected in parallel with each other, and the preset value corresponds to a maximum rating of the plurality of fuses.

In an embodiment of the invention, the isolation device includes a capacitor and a fuse connected in series with each other, and the preset value corresponds to a smaller of a saturation energy of the capacitor or a rating of the fuse.

In an embodiment of the invention, the transient voltage suppression device further includes a back drive diode between the node and the power supply terminal.

Based on the above, in the present invention, the isolation device is disposed between the node between the Zener diode and the power supply terminal and the first terminal of the diode string, so that the ESD current (i.e., instantaneous current) can be eliminated by the Zener diode and the EOS current (i.e., DC high current) can be blocked, thereby preventing the system from burning out. In addition, in another embodiment of the present invention, the back drive diode is also optionally disposed between the node and the power supply terminal to achieve a double protection effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
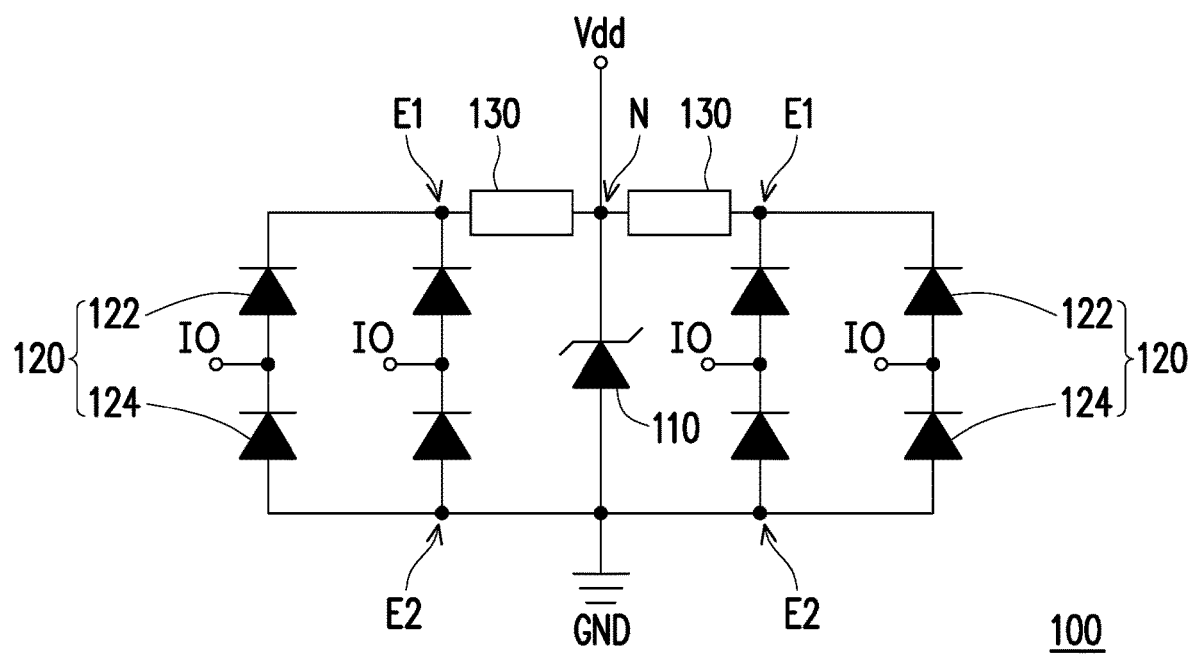
FIG. 1 is a circuit diagram showing a transient voltage suppression device of a first embodiment of the present invention.

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1 is a circuit diagram showing a transient voltage suppression device of a first embodiment of the present invention.

Referring to FIG. 1, in the first embodiment of the present invention, a transient voltage suppression device 100 includes a power supply terminal Vdd, a ground terminal GND, a Zener diode 110, a plurality of diode strings 120, and an isolation device 130.

Specifically, the Zener diode 110 is coupled between the power supply terminal Vdd and the ground terminal GND. A node N is between the Zener diode 110 and the power supply terminal Vdd. Each diode string 120 has a first terminal E1, a second terminal E2, and an I/O terminal 10. In the present embodiment, as shown in FIG. 1, each diode string 120 includes channel diodes 122, 124 connected in series with each other. An anode of the channel diode 122 is coupled to a cathode of the channel diode 124 and coupled to the I/O terminal 10. Although only a single channel diode 122 and a single channel diode 124 connected in series with each other are illustrated in FIG. 1, the present invention is not limited thereto. In other embodiments, the number of the channel diode 122 or the channel diode 124 may be greater than one or more. The second terminal E2 of the diode string 120 is coupled to the ground terminal GND.

The isolation device 130 is coupled between the node N and the first terminal E1. That is, the isolation device 130 is coupled between the power supply terminal Vdd and the diode string 120. When a current value is greater than the normal working current value, or a current direction is different from the normal working current direction, it may be referred to as an abnormal current. When an abnormal current flows through the isolation device 130, and its energy per unit time exceeds a preset value of the isolation device 130, the isolation device 130 blocks a path of the abnormal current, thereby achieving the protection effect. Taking a motherboard with the transient voltage suppression device 100 as an example, when the motherboard is in the off state and is plugged in a charged display, a reverse current flows from the display through the I/O terminal IO and back to the power supply terminal Vdd of the motherboard. In the case, when the reverse current flows through the isolation device 130 and exceeds the preset value of the isolation device 130, the isolation device 130 would block or cut the path of the reverse current, thereby avoiding other components of the power supply terminal Vdd of the motherboard from damaging. On the other hand, when the ESD phenomenon occurs, the Zener diode 110 is turned on, thereby generating an abnormal current path between the I/O terminal IO and the ground terminal GND. However, the abnormal current generated by the ESD phenomenon has an energy per unit time that does not reach the preset value of the device 130. Accordingly, the isolation device 130 would not block the abnormal current path, to vent the current generated by the ESD phenomenon, thereby achieving the effect of electrostatic discharge protection. In addition, when an electrical over stress (EOS) phenomenon occurs, the Zener diode 110 is turned on, thereby causing an abnormal current path between the I/O terminal IO and the ground terminal GND. The isolation device 130 may block the abnormal current path to prevent the circuit of the power supply terminal Vdd or the ground terminal GND from being burned out, thereby achieving the protection.

Figure 2A:
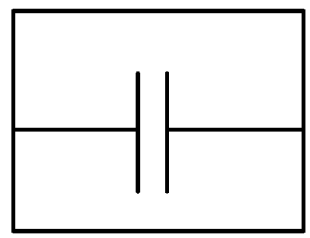
FIG. 2A is a circuit diagram showing an isolation device of an embodiment of the present invention.
Figure 2B:
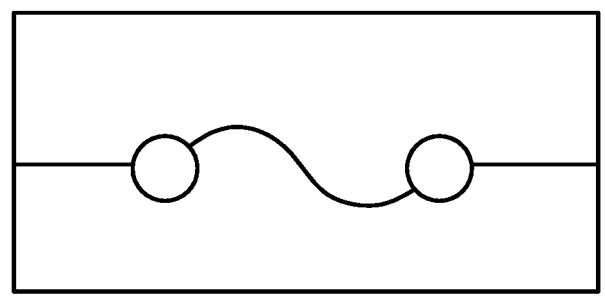
FIG. 2B is a circuit diagram showing an isolation device of another embodiment of the present invention.
Figure 2C:
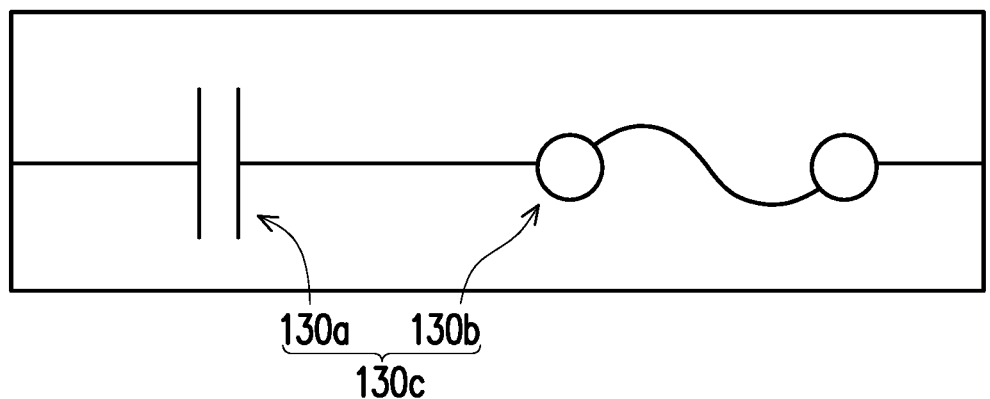
FIG. 2C is a circuit diagram showing an isolation device of other embodiment of the present invention.

FIG. 2A is a circuit diagram showing an isolation device of an embodiment of the present invention. FIG. 2B is a circuit diagram showing an isolation device of another embodiment of the present invention. FIG. 2C is a circuit diagram showing an isolation device of other embodiment of the present invention.

In an embodiment, the isolation device 130 illustrated in FIG. 1 may be a capacitor 130a (as shown in FIG. 2A), but the invention is not limited thereto. In another embodiment, the isolation device 130 may be a fuse 130b, as shown in FIG. 2B. In other embodiment, the isolation device 130 may also be a component 130c having the capacitor 130a and the fuse 130b connected in series with each other, as shown in FIG. 2C.

In detail, when the isolation device 130 is the capacitor 130a, the preset value of the isolation device 130 may correspond to the saturation energy or capacitance value of the capacitor 130a. That is, when the energy of the abnormal current exceeds the saturation energy or capacitance value of the capacitor 130a, the capacitor 130a has been charged completely to form an open circuit, thereby blocking the path of the abnormal current. In addition, when the isolation device 130 is the fuse 130b, the preset value of the isolation device 130 may correspond to a rating of the fuse 130b. In other words, when the energy of the abnormal current exceeds the rating of the fuse 130b, the fuse 130b is cut to form an open circuit, thereby blocking the path of the abnormal current. Further, when the isolation device 130 is the component 130c with the capacitor 130a and the fuse 130b connected in series with each other, the preset value of the isolation device 130 may correspond to the small one of the saturation energy of the capacitor 130a or the rating of the fuse 130b.

FIG. 3A to FIG. 3D are respectively schematic views showing the operation of the isolation device under an abnormal current according to another embodiment of the present invention. FIG. 4 is a top view showing an isolation device of another embodiment of the present invention.

In alternative embodiments, the isolation device 130 includes a component 130d having a plurality of fuses 130d1, 130d2, 130d3, 130d4 connected in parallel with one another. The preset value of the isolation device 130 may correspond to a maximum rating of the fuses 130d1, 130d2, 130d3, 130d4. In the present embodiment, the ratings of the fuses 130d1, 130d2, 130d3, 130d4 are dependent on widths W1, W2, W3, W4 of the fuses 130d1, 130d2, 130d3, 130d4, as shown in FIG. 4. When the width of the fuse is wider, the rating of the fuse is greater, and the fuse is not easy to be cut. Conversely, when the width of the fuse is narrower, the rating of the fuse is less.

Figure 3A:
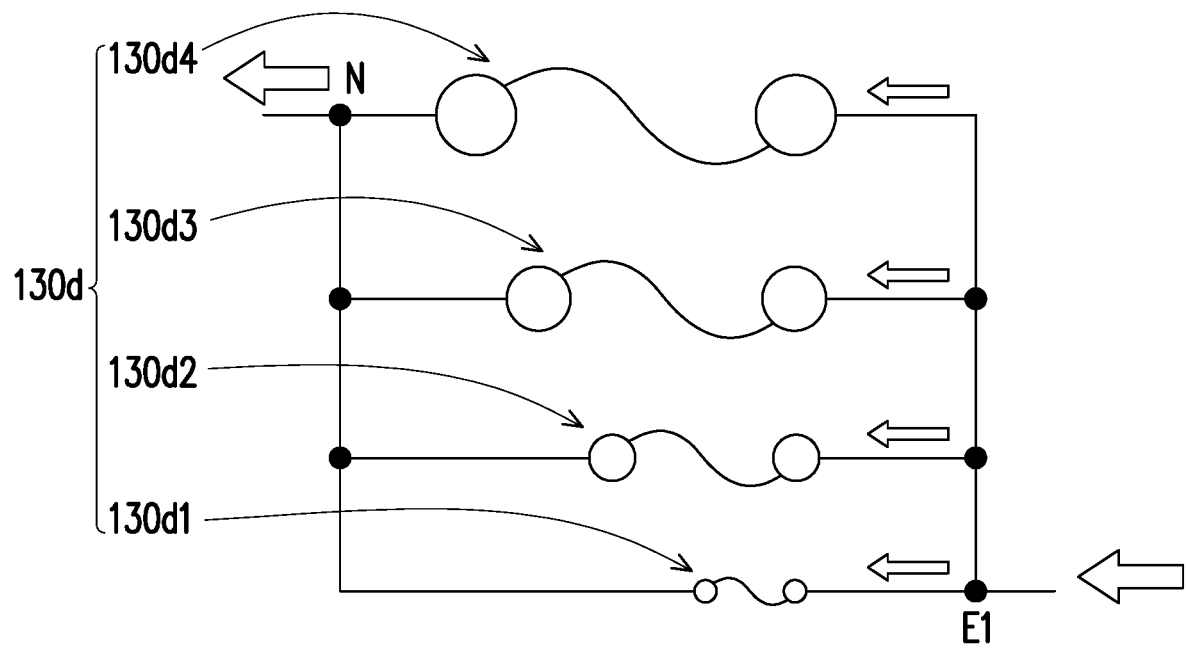
FIG. 3A to FIG. 3D are respectively schematic views showing the operation of the isolation device under an abnormal current according to another embodiment of the present invention.
Figure 3B:
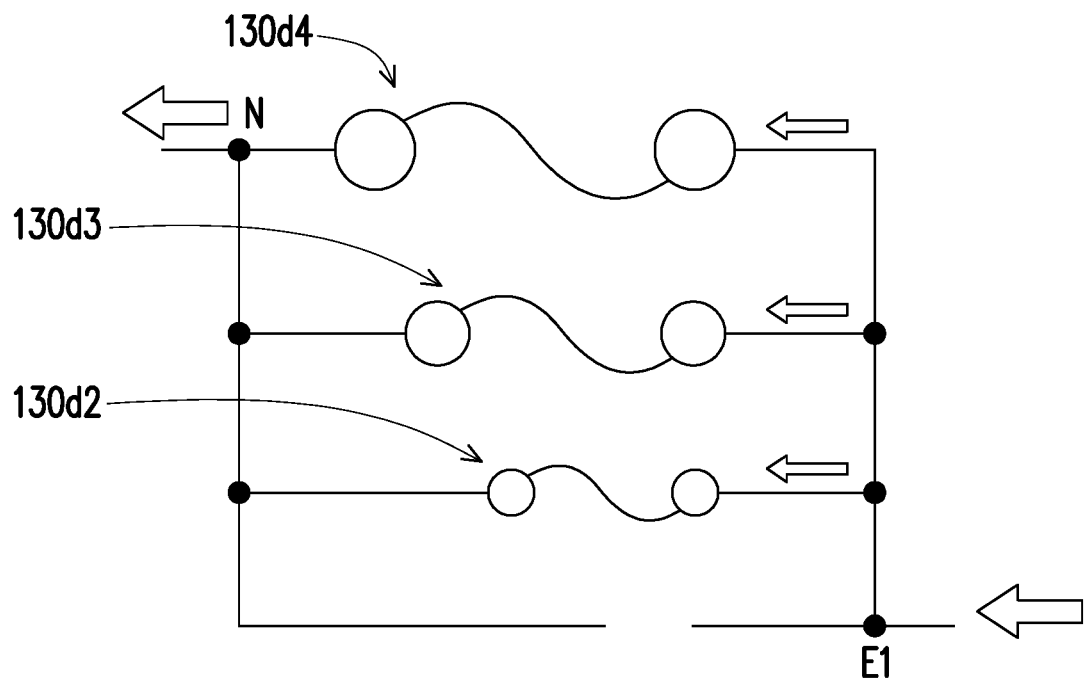
Figure 3C:
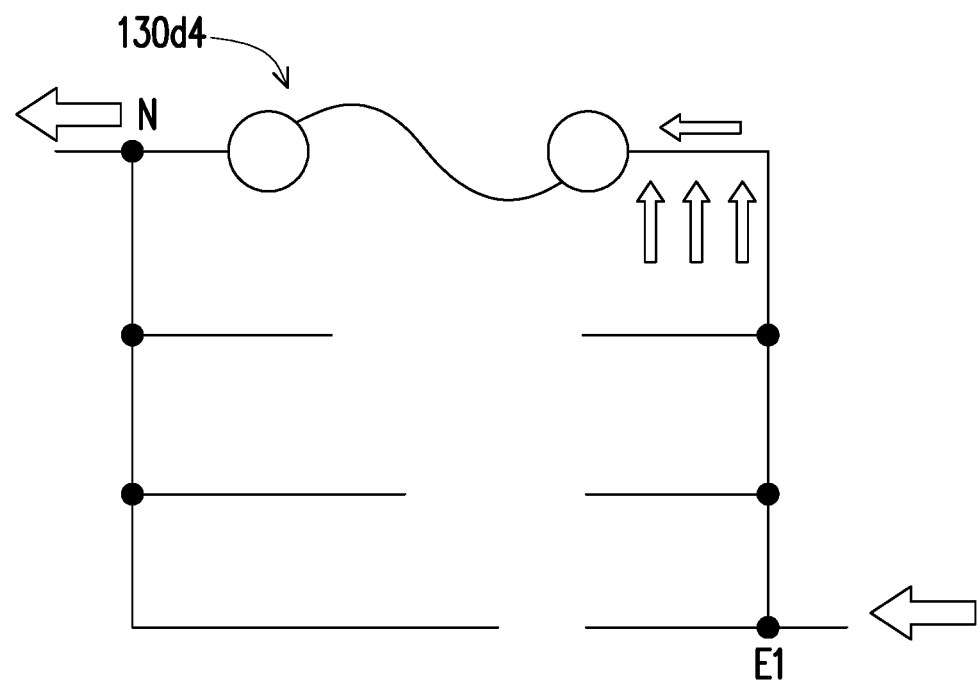
Figure 3D:
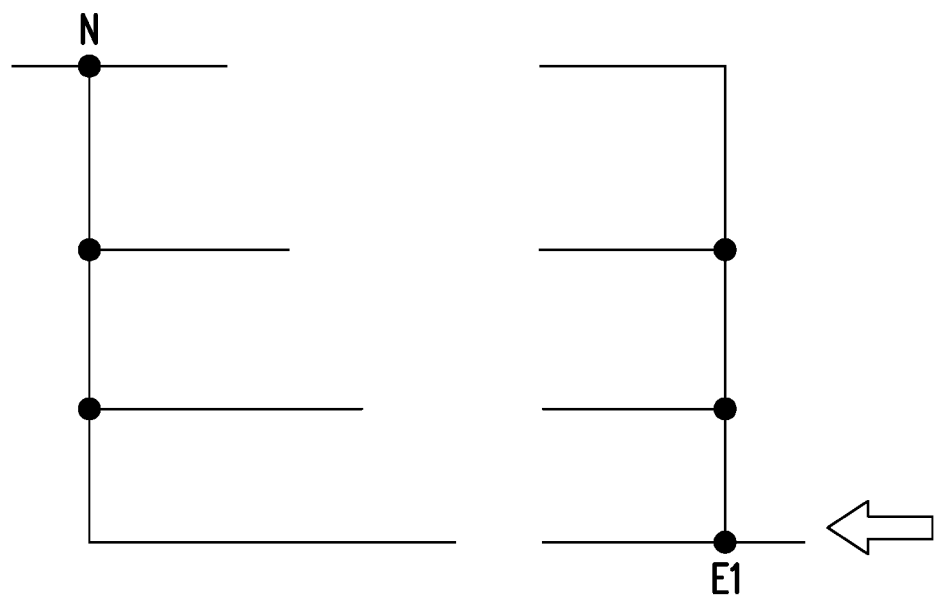
Figure 4:
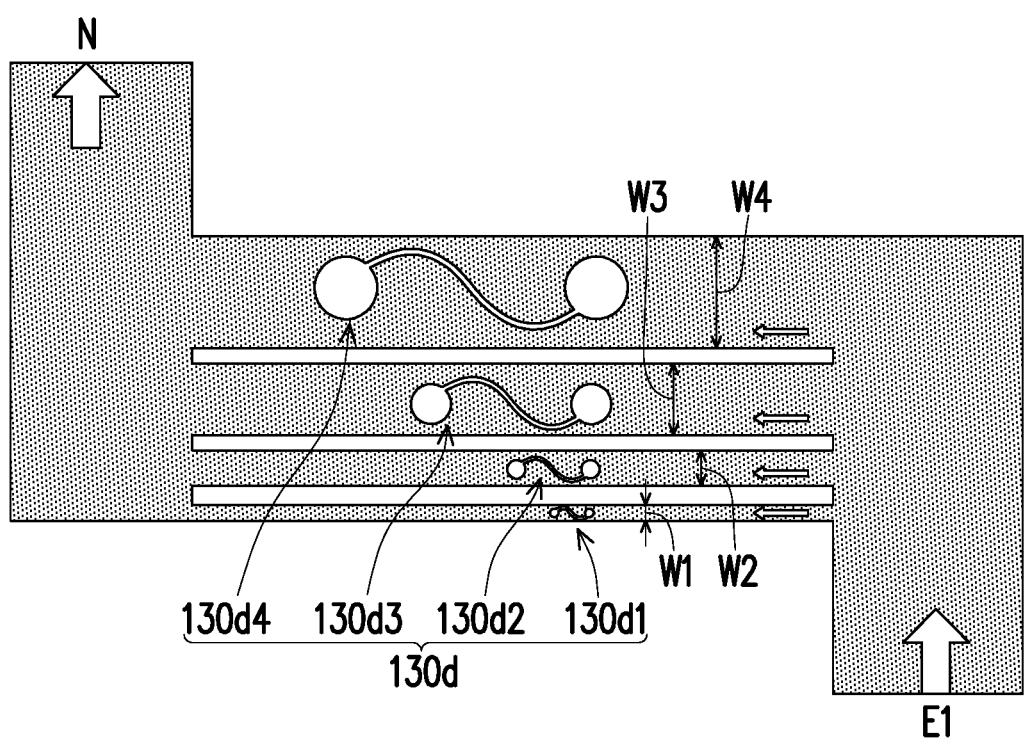
FIG. 4 is a top view showing an isolation device of another embodiment of the present invention.

Specifically, as shown in FIG. 3A, the current may flow from the first terminal E1 of the diode string through the fuses 130d1, 130d2, 130d3, and 130d4 respectively and flow to the node N between the Zener diode and the power supply terminal. When the abnormal current or the electrical over stress (EOS) current occurs, the fuse 130d1 with the minimum width W1 is first burned out, as shown in FIG. 3B. In the case, the lowermost path cannot be conducted due to the open circuit, so that the EOS current flows to the other fuses 130d2, 130d3, 130d4. Next, as shown in FIG. 3B and FIG. 3C, the fuses 130d2, 130d3 are sequentially disconnected. Finally, as shown in FIG. 3D, when the fuse 130d4 with the maximum width W4 is burned out, the entire isolation device 130d would be formed as the open circuit to block all paths of the EOS current. In the present embodiment, the fuses 130d1, 130d2, 130d3, and 130d4 of different widths are sequentially disconnected to achieve the high speed open circuit. In the case, the reaction rate of the isolation device can be greatly increased to accelerate the protection effect.

Referring to FIG. 4, the fuses 130d1, 130d2, 130d3, 130d4 may be conductive layers, variable resistance layers, or a combination thereof in an interconnect structure disposed on a substrate. In some embodiments, the conductive layers may be metal layers, polysilicon layers, or a combination thereof. The material of the metal layers may include copper, aluminum, aluminum copper, tungsten, alloys thereof or the like. The material of the polysilicon layers may include doped polysilicon, undoped polysilicon, or a combination thereof.

In alternative embodiments, the material of the variable resistance layers may comprise a positive temperature coefficient (PTC) thermistor material, a negative temperature coefficient (NTC) thermistor material, or a combination thereof. The resistance value of the above variable resistance layer may vary with temperature. In the embodiment, the conduction state of the isolation device is reversible. That is to say, the temperature change may be adjusted to change the resistance value of the isolation device to make the isolation device conduct or close to open circuit. For example, when a large EOS current passes through an isolation device composed of the variable resistor, the temperature of the variable resistor rises to cause the resistance value of the variable resistor also increases, thereby forming a state close to the open circuit. Then, after the temperature drops, the variable resistor may also return to the on state.

Figure 5:
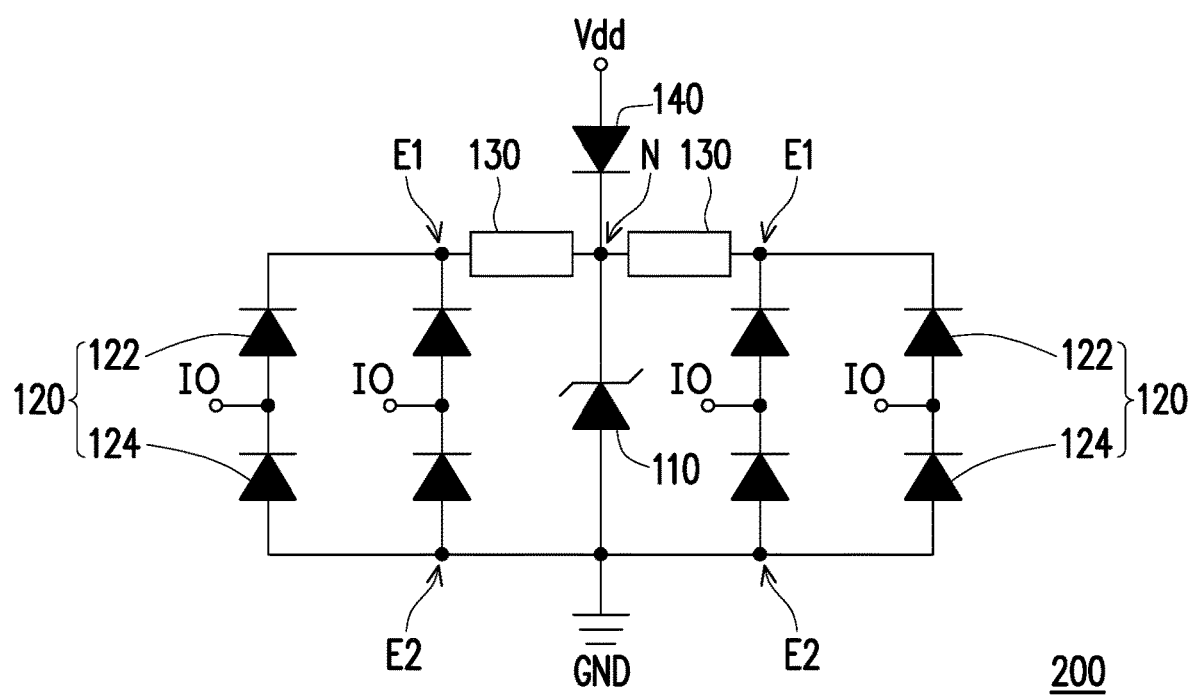
FIG. 5 is a circuit diagram showing a transient voltage suppression device of a second embodiment of the present invention.

FIG. 5 is a circuit diagram showing a transient voltage suppression device of a second embodiment of the present invention.

Referring to FIG. 5, a transient voltage suppression device 200 of the second embodiment is similar to the transient voltage suppression device 100 of the first embodiment and the same components have been described in detail in the above embodiments. Thus, details thereof are omitted here. A main difference therebetween lies in that the transient voltage suppression device 200 further includes a back drive diode 140 coupled between the node N and the power supply terminal Vdd. As shown in FIG. 5, an anode of the reverse drive diode 140 is coupled to the power supply terminal Vdd, and a cathode of the reverse drive diode 140 is coupled to the node N. In the case, the reverse drive diode 140 and the isolation device 130 together may block the abnormal current flow to the power supply terminal Vdd, thereby achieving the double protection.

In summary, in one embodiment of the present invention, the isolation device is disposed between the node between the Zener diode and the power supply terminal and the first terminal of the diode string, so that the ESD current (i.e., instantaneous current) can be eliminated by the Zener diode and the EOS current (i.e., DC high current) can be blocked, thereby preventing the system from burning out. In addition, in another embodiment of the present invention, the back drive diode is also optionally disposed between the node and the power supply terminal to achieve the double protection effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transient voltage suppression device, comprising:
a power supply terminal;
a ground terminal;
a Zener diode, coupled between the power supply terminal and the ground terminal, wherein a node is between the Zener diode and the power supply terminal;
a diode string, having a first terminal, a second terminal, and an input/output (I/O) terminal, wherein the second terminal is coupled to the ground terminal; and
an isolation device, coupled between the node and the first terminal, wherein the isolation device blocks a path of an abnormal current when the abnormal current flows through the isolation device and an energy of the abnormal current per unit time exceeds a preset value of the isolation device,
wherein the isolation device does not block the path of the abnormal current when the abnormal current flows through the isolation device and the energy of the abnormal current per unit time does not exceed the preset value,
wherein the Zener diode is directly coupled to the power supply terminal and the ground terminal, and the I/O terminal is not directly coupled to the Zener diode,
wherein the isolation device comprises a plurality of fuses connected in parallel with each other, and the preset value corresponds to a maximum rating of the plurality of fuses.

2. The transient voltage suppression device of claim 1, wherein the plurality of fuses each comprises a metal layer, a polysilicon layer, or a combination thereof.

3. The transient voltage suppression device of claim 1, further comprising a back drive diode between the node and the power supply terminal.

* * * * *